United States Patent [19]

Watanabe

[11] Patent Number: 4,825,141

[45] Date of Patent: Apr. 25, 1989

[54] DC POWER SUPPLY DEVICE

[75] Inventor: Yukio Watanabe, Saitama, Japan

[73] Assignee: Kabushiki Kaisha Toshiba, Kawasaki, Japan

[21] Appl. No.: 91,027

[22] Filed: Aug. 31, 1987

[30] Foreign Application Priority Data

Sep. 12, 1986 [JP] Japan ................................ 61-215231

[51] Int. Cl.[4] ................................................ G03F 1/46

[52] U.S. Cl. ...................................... 323/271; 307/44; 307/63

[58] Field of Search .................. 323/268, 271; 307/43, 307/44, 46, 63, 72

[56] References Cited

U.S. PATENT DOCUMENTS 4,585,986 4/1986 Dyer .................................. 323/271

4,631,736 12/1986 Yamanoue et al. ............... 307/44 X

FOREIGN PATENT DOCUMENTS 59-91520 5/1984 Japan .

*Primary Examiner*—Patrick R. Salce

*Assistant Examiner*—Kristine Peckman

*Attorney, Agent, or Firm*—Foley & Lardner, Schwartz, Jeffery, Schwaab, Mack, Blumenthal & Evans

[57] ABSTRACT

A device for supplying specified time-dependent DC current to a reactive load. The device comprises: a DC current source; a DC voltage source connected in series to the DC current source; a detector of the current in the load; a current source controller for causing the detected current to be approximately equal to a stipulated variable current; a detector of the output voltage of the current source; and a voltage source controller to cause the detected output voltage of the current source to achieve a predetermined constant voltage.

5 Claims, 1 Drawing Sheet

DC POWER SUPPLY DEVICE

BACKGROUND OF THE INVENTION

1. Field of the Invention

This invention relates to a DC electric power supply device, and more particularly to a DC power supply device for reactive loads requiring strictly controlled direct current.

2. Description of the Prior Art

Accelerators of electrons, protons, etc. are used for research in nuclear physics. In the accelerators, electromagnets are used for controlling the electrons and protons, and the electromagnets are controlled by the current flowing in electromagnetic coils. The current in the coils must be changed rapidly, and precisely controlled as specified.

In a conventional magnetic coil for such an accelerator, the current is supplied by a DC power source and controlled by a transistor based on the measured current in the coil and the stipulated time-dependent current.

The voltage V imposed on the coil is given by $$V=L(di/dt)+Ri$$

where L and R denote reactance and resistance of the coil, respectively, i denotes the current in the coil and t denotes time.

Suppose the stipulated current i increases rapidly from zero to a positive value for a time period from t=0 to t=t1, and decreases rapidly to zero for a time period from t=t1 to t=t2, as shown in FIG. 2 (a). When the current i increases, di/dt becomes positive, and V becomes positive, which means V and i are in the same direction. However, when the current i decreases rapidly, di/dt becomes large in the negative direction, and V becomes negative, which means V and i are in opposite directions.

The current i can be controlled by a transistor. The voltage of the output of the DC power source minus the collector-emitter voltage $V_{CE}$ of the transistor is imposed on the coil. In this control, however, the power of $V_{CE}i$ is lost in the transistor. The voltage $V_{CE}$ becomes especially large and the power loss in the transistor becomes larger when the specified current decreases. Therefore, the dimensions of the transistor must be sufficiently large to dissipate the heat due to the large power loss in it, which results in expensive power supply devices.

Japanese Patent Disclosure (Kokai) No. 59-1520 discloses a DC power supply device for such magnetic coils. It has improve characteristics for increasing specified currents. However, when the current decreases, rapid and precise control cannot be achieved.

SUMMARY OF THE INVENTION

An object of this invention is to provide a DC power supply device which can supply precise, rapidly increasing and decreasing currents to a reactive load.

Another object of this invention is to provide a method of supplying to a reactive load DC current which rapidly increases and decreases and is precisely controlled.

According to the invention, there is provided a device for supplying DC power to a load, the device comprising: a DC current source; a DC voltage source connected in series to the current source; means for detecting the current in the load; means for controlling the current source so that the detected current becomes close to a stipulated current; means for detecting the output voltage of the current source; and means for controlling the voltage source so that the detected output voltage of the voltage source becomes close to a pre-determined voltage.

According to another aspect of the invention, there is provided a method of supplying DC power to a load, the method comprising the steps of: detecting the current in the load; controlling a current source which is connected to supply current to the load, so that the detected current in the load becomes close to a stipulated current; measuring the output voltage of the current source; and controlling a voltage source which is connected in series to the current source, so that the output voltage of the current source becomes close to a predetermined voltage.

According to yet another aspect of the invention, there is provided a device for supplying DC power to a load, the device comprising: a DC current source; a DC voltage source connected in series to the current source; means for detecting the current in the load; means for controlling the current source and voltage source so that the detected current becomes close to a stipulated current; and means for switching the voltage polarity of the voltage source relative to the current source so that the voltage source is connected to the current source in a positive direction when the stipulated current increases, and in a negative direction when the stipulated current decreases.

Further objects, features and advantages of the present invention will become apparent from the detailed description of the preferred embodiment that follows, when considered with the attached drawings.

BRIEF DESCRIPTION OF THE DRAWINGS

The accompanying drawings, which are incorporated in and constitute a part of this specification, illustrate an embodiment of the invention and together with the description, serve to explain the principles of the invention. In the drawings.

DETAILED DESCRIPTION OF THE PREFERRED EMBODIMENT

Figure 1:
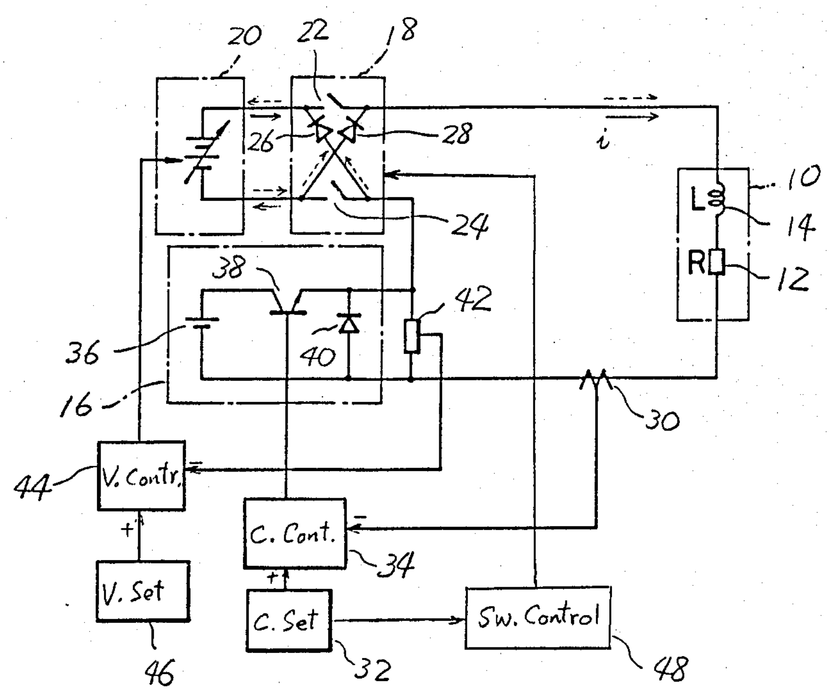
FIG. 1 is a schematic diagram of an embodiment of a DC power supply device of the invention.

Referring to FIG. 1, an embodiment of the present invention is shown. A numeral 10 denotes a reactive load, such as an electromagnetic coil for an accelerator of charged particles. The load has a resistance 12 and a reactance 14 in series.

A DC current source 16 and a polarity switching unit 18 are connected to the load 10 in series. A DC voltage source 20 is connected to the switching unit 18. The switching unit 18 has two switches 22 and 24 and two diodes 26 and 28. When the two switches 22 and 24 are turned on, the voltage source 20 is connected to the current source 16 in series in a positive direction, and the currents in the diodes 26 and 28 are blocked because they are reverse biased by the voltage. The current flows from the current source 16 to the load 10 through the switch 24, the voltage source 20 (in positive direction) and the switch 22 in that order, as shown by the solid arrows in FIG. 1. The voltages of the current source 16 and of the voltage source 20 are added, and the total added voltage is imposed on the load 10.

When the switches 22 and 24 are turned off, the current source 16 and the voltage source 20 are connected in series in a negative direction and the voltage of the current source 16 minus the voltage of the voltage source 20 is imposed on the load 10. In this case, the current flows from the current source 16 to the load 10 through the diode 26, the voltage source 20 (in negative direction) and the diode 28 in that order, as shown by the dotted arrows in FIG. 1.

It will be understood by those skilled in the art that the switches 22 and 24 may be relays, power transistors or the like.

A current detector 30 is arranged to detect the current in the load 10. A current setter 32 generates a time dependent signal indicating the stipulated current for the load 10. The signals indicating the stipulated current and the detected current are compared in a current controller 34. The current controller 34 controls the current source 16 so that the difference between the stipulated current and the detected current is minimized.

The current source 16 has a high accuracy of $\pm 1\times 10^{-2}\%$ to $\pm 1\times 10^{-4}\%$ and a narrow range of output voltage, and comprises a constant DC power source 36, an NPN transistor 38 and a diode 40. The voltage source 20 has a comparatively low accuracy of more than $\pm 1\times 10^{-1}\%$ and a wide range of output voltage.

A voltage detector 42 is arranged to detect the output voltage of the current source 16. The detected voltage is compared in a voltage controller 44 with a constant, predetermined standard value set in a voltage setter 46.

The voltage controller 44 controls the voltage source 20 so that the difference between the predetermined voltage and the detected voltage is minimized.

The switching unit 18 is controlled by a switch controller 48. When the stipulated current set in the current setter 32 increases, the switches 22 and 24 are turned on and the voltage source 20 is connected in a positive direction to the current source 16. When the stipulated current set in the current setter 32 decreases, the switches 22 and 24 are turned off and the voltage source 20 is connected in a negative direction with the current source 16.

Figure 2:
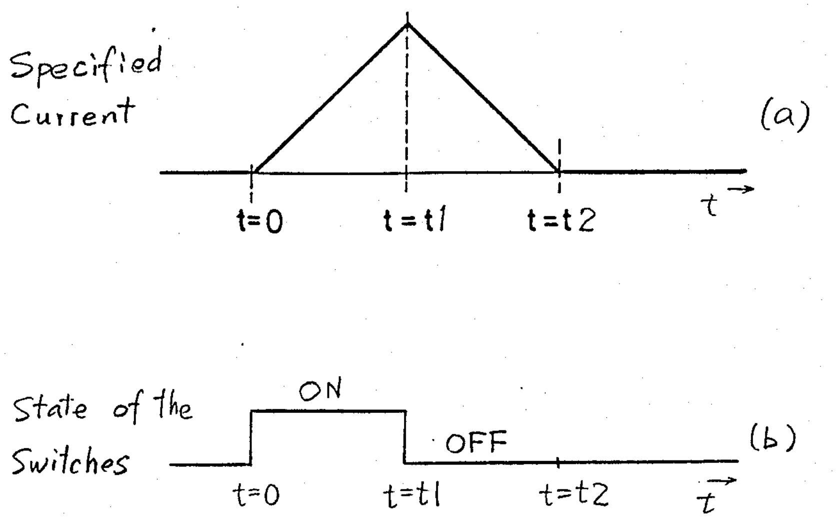
FIG. 2(a) is a graph of specified time-dependent current in the load.
FIG. 2(b) is a graph showing the state variation of the switches 22 and 24 in FIG. 1 in accordance with the current variation shown in FIG. 2(a).

In the case shown in FIG. 2(a), the stipulated current increases from zero during the time t=0 to t=t1, and then it decreases to zero during the time t=t1 to t=t2. The switches 22 and 24 are turned on during the time of t=0 to t=t1, and they are turned off after t=t1, as shown in FIG. 2(b).

In the embodiment described above, the required maximum output voltage of the current source 16 can be small, because the voltage source 20 has a wide range of output voltage and is controlled so that the output voltage of the current source 16 becomes approximately constant. Furthermore, owing to the action of the switching unit 18, the maximum output voltage of the current source 16 is minimized regardless of the current increasing or decreasing. Therefore, the collector-emitter voltage of the transistor 38 can be maintained in a small range, and the current source 16 can be accurately controlled and can be compact and inexpensive. On the other hand, since the voltage source 20 is used only for rough control, accurate control is not required, and therefore, it can also be inexpensive. The combination of the current source 16, the voltage source 20 and the switching unit 18 provides an inexpensive, accurately controllable power source for both increasing and decreasing current.

The foregoing description has been set forth merely to illustrate a preferred embodiment of the invention and is not intended to be limiting. Since modification of the described embodiment incorporating the spirit and substance of the invention may occur to persons skilled in the art, the scope of the invention should be limited solely with respect to the appended claims and equivalents.

What is claimed is:

1. A device for supplying DC power to a load, the device comprising:

a DC current source;

a DC voltage source connected in series to the current source, wherein the current source has a narrower range of output voltage than the voltage source;

means for detecting current in the load;

means for controlling the current source so that the detected current becomes close to a stipulated current;

means for detecting an output voltage of the current source; and means for controlling the voltage source so that the detected output voltage of the current source becomes close to a predetermined value.

2. A device according to claim 1, further comprising means for switching a voltage polarity of said voltage source relative to said current source so that the voltage source is connected to the current source in a positive direction when the stipulated current increases, and in a negative direction when the stipulated current decreases.

3. A method of supplying DC power to a load, the method comprising steps of:

detecting current in the load;

controlling a current source which is connected to supply current to the load, so that the detected current in the load becomes close to a stipulated current;

measuring an output voltage of the current source; and controlling a voltage source which is connected in series to the current source, so that the output voltage of the current source becomes close to a predetermined voltage.

4. A method according to claim 3, further comprising steps of switching a voltage polarity of the voltage source relative to the current source so that the voltage source is connected to the current source in a positive direction when the stipulated current increases, and in a negative direction when the stipulated current decreases.

5. A device for supplying DC power to a load, the device comprising:

a DC current source;

a DC voltage source connected in series to the current source;

means for detecting a current in the load;

means for controlling the current source and voltage source so that the detected current becomes close to a stipulated current; and means for switching a voltage polarity of said voltage source relative to said current source so that the voltage source is connected to the current source in a positive direction when the stipulated current increases, and in a negative direction when the stipulated current decreases.

* * * * *